(12) United States Patent
Baek et al.

(10) Patent No.: US 12,334,186 B2
(45) Date of Patent: Jun. 17, 2025

(54) MEMORY DEVICE, MEMORY SYSTEM AND METHOD FOR OPERATING MEMORY SYSTEM INCLUDING COMMAND AND ADDRESS TRAINING

(71) Applicant: Samsung Electronics Co., Ltd., Suwon-si (KR)

(72) Inventors: Jaehyeok Baek, Suwon-si (KR); Hye-Ran Kim, Suwon-si (KR); Min Ho Maeing, Suwon-si (KR); SungYong Cho, Suwon-si (KR); MoonChul Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 130 days.

(21) Appl. No.: 18/166,737

(22) Filed: Feb. 9, 2023

(65) Prior Publication Data
US 2023/0402074 A1 Dec. 14, 2023

(30) Foreign Application Priority Data

Jun. 10, 2022 (KR) .................. 10-2022-0071055
Jul. 12, 2022 (KR) .................. 10-2022-0085641

(51) Int. Cl.
*G11C 16/04* (2006.01)
*G11C 7/10* (2006.01)
*G11C 7/22* (2006.01)
*G11C 29/52* (2006.01)

(52) U.S. Cl.
CPC ............ *G11C 7/222* (2013.01); *G11C 7/1093* (2013.01); *G11C 29/52* (2013.01)

(58) Field of Classification Search
CPC ....... G11C 7/222; G11C 7/1093; G11C 29/52; G11C 29/50012; G11C 2029/0411; G11C 29/028; G11C 29/023
USPC ...................................................... 365/233.1
See application file for complete search history.

(56) References Cited

U.S. PATENT DOCUMENTS

| 8,533,538 B2 | 9/2013 | Chaudhuri et al. |
| 8,659,959 B2 | 2/2014 | Kim et al. |
| 9,218,575 B2 | 12/2015 | Mozak et al. |
| 9,959,918 B2 | 5/2018 | Kim et al. |

(Continued)

FOREIGN PATENT DOCUMENTS

KR         101876619 B1      7/2018

*Primary Examiner* — Tha-O H Bui
(74) *Attorney, Agent, or Firm* — Harness, Dickey & Pierce, P.L.C.

(57) ABSTRACT

Provided is a memory system including: a memory device; and a memory controller configured to transmit a command and address (CA) signal and a data clock (WCK) signal to the memory device, and transmitting a data (DQ) signal to the memory device or receive the DQ signal from the memory device. The memory device may include a clock distribution network configured to generate a first division clock signal for sampling the CA signal and a second division clock signal for sampling the DQ signal from the data clock signal, a CA sampler configured to sample the CA signal based on the first division clock signal, and a CA parity check circuitry configured to output a parity error signal in response to a parity error occurring for the CA signal, and the memory controller may include processing circuitry configured to enter CA training in response to receiving the parity error signal.

20 Claims, 14 Drawing Sheets

(56) References Cited

U.S. PATENT DOCUMENTS

| | | | |
|---|---|---|---|
| 10,186,309 B2 * | 1/2019 | Oh | G11C 7/1093 |
| 10,283,186 B2 * | 5/2019 | Jeon | G11C 7/1093 |
| 10,324,490 B2 | 6/2019 | Mozak | |
| 10,796,737 B1 | 10/2020 | Oh et al. | |
| 11,196,425 B1 | 12/2021 | Lin et al. | |
| 2011/0235459 A1 * | 9/2011 | Ware | G06F 13/1689 |
| | | | 365/233.11 |

* cited by examiner

MEMORY DEVICE, MEMORY SYSTEM AND METHOD FOR OPERATING MEMORY SYSTEM INCLUDING COMMAND AND ADDRESS TRAINING

CROSS-REFERENCE TO RELATED APPLICATION

This application claims priority to and the benefit of Korean Patent Application No. 10-2022-0071055 filed in the Korean Intellectual Property Office on Jun. 10, 2022, and Korean Patent Application No. 10-2022-0085641 filed in the Korean Intellectual Property Office on Jul. 12, 2022, the contents of which are incorporated herein by reference in their entirety.

BACKGROUND

(a) Field

The present disclosure relates to a memory device, a memory system and a method for operating the memory system.

(b) Description of the Related Art

A memory device can be divided into a volatile memory device and a nonvolatile memory device. The volatile memory device may be a memory device that destroys data that is stored thereon when the power supply is interrupted or turned off, and the nonvolatile memory device may be a memory device that maintains the data that is stored thereon even if the power supply is interrupted or turned off. Examples of the volatile memory device include a Random Access Memory (RAM), a Static RAM (SRAM), a Dynamic RAM (DRAM), a Synchronous DRAM (SDRAM), etc., and examples of the nonvolatile memory device include a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RRAM), a Ferroelectric RAM (FRAM), etc.

In order to support a high-speed interface with the memory device, a memory controller (or processor) may provide a clock signal to the memory device. The memory device may process signals received from the memory controller in response to the clock signal received from the memory controller or synchronize signals transmitted to the memory controller with the clock signal.

SUMMARY

Example embodiments provide a memory device, a memory system and a method for operating the memory system which are capable of providing a training technique having improved accuracy for a signal transmitted between a memory controller and a memory device An example embodiment provides a memory system including: a memory device; and a memory controller configured to transmit a command and address (CA) signal and a data clock signal to the memory device, and transmit a data (DQ) signal to the memory device or receive the DQ signal from the memory device. The memory device may include a clock distribution network configured to generate a first division clock signal for sampling the CA signal and a second division clock signal for sampling the DQ signal from the data clock signal, a CA sampler configured to sample the CA signal based on the first division clock signal, and a CA parity check circuitry configured to output a parity error signal in response to a parity error occurring for the CA signal. The memory controller may include processing circuitry configured to enter CA training in response to receiving the parity error signal.

Another example embodiment provides a memory device including: a first pad configured to receive a data clock signal; a second pad configured to receive a command and address signal; a third pad configured to transmit or receive a data (DQ) signal; a clock distribution network configured to generate a first division clock signal for sampling the CA signal and a second division clock signal for sampling the DQ signal from the data clock signal; a CA sampler sampling the CA signal based on the first division clock signal; a DQ sampler configured to sample the data signal based on the second division clock signal; and a CA parity check circuitry configured to trigger CA training in response to a parity error occurs for the CA signal.

Yet another example embodiment provides a method for operating a memory system, which includes: transmitting a command and address (CA) signal and a data clock signal to a memory device from a memory controller, and transmitting or receiving a data signal; generating, by the memory device, a first division clock signal for sampling the CA signal and a second division clock signal for sampling the DQ signal from the data clock signal; sampling, by the memory device, the CA signal based on the first division clock signal; outputting, by the memory device, a parity error signal in response to a parity error occurring for the CA signal; and entering, by the memory controller, CA training in response to receiving the parity error signal.

DETAILED DESCRIPTION OF EXAMPLE EMBODIMENTS

Figure 1:
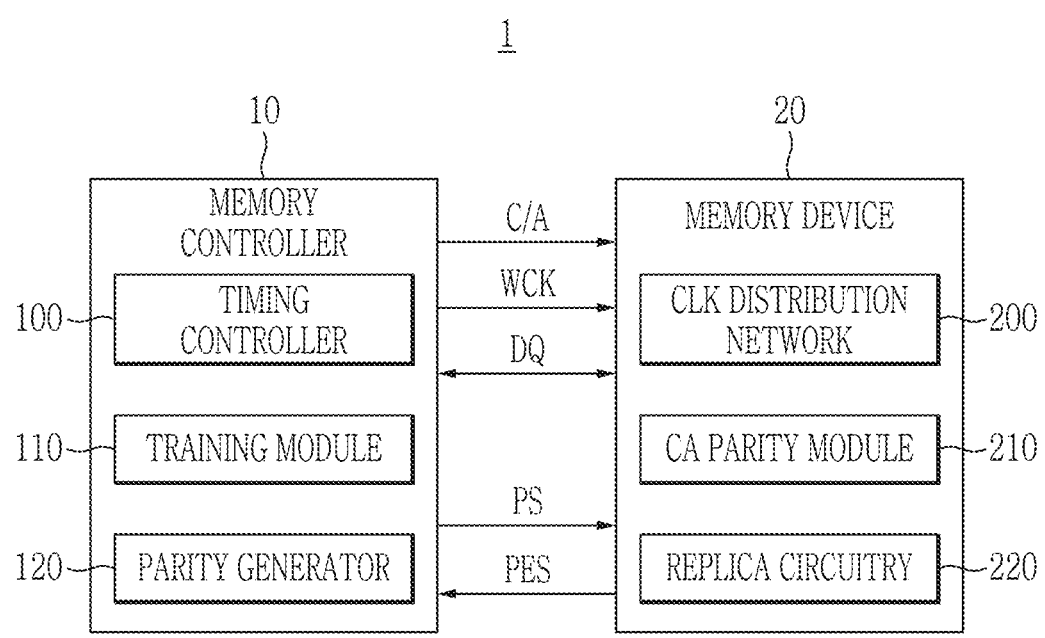
FIG. 1 is a diagram illustrating a memory system according to some example embodiments.

In the following detailed description, only certain example embodiments have been shown and described, simply by way of illustration. As those skilled in the art would realize, the described example embodiments may be modified in various different ways, all without departing from the spirit or scope of the example embodiments.

Accordingly, the drawings and description are to be regarded as illustrative in nature and not restrictive. Like reference numerals designate like elements throughout the specification.

Further, unless an expression disclosed as a singular number may be interpreted as a singular number or a plural number unless an explicit expression such as "one" or "single" is used. Terms including an ordinary number, such as first and second, are used for describing various elements, but the elements are not limited by the terms. The terms are used to discriminate one constituent element from another component.

FIG. 1 is a diagram illustrating a memory system according to some example embodiments.

Referring to FIG. 1, a memory system 1 according to some example embodiments may include a memory controller 10 and a memory device 20.

The memory controller 10 may receive an access request to the memory device 20 from a host and communicate with the memory device 20 in response thereto. The memory controller 10 may also be an independent component, and also be included in other independent components (e.g., a processor, a central processing unit (CPU), a graphic processing unit (GPU), an intellectual property (IP) core, etc.).

The memory device 20 may include a memory cell array including a plurality of memory cells. In some example embodiments, the memory cell may be a volatile memory cell, and the memory device 20 as a non-limiting example may be a Dynamic Random Access Memory (DRAM), a Static Random Access Memory (SRAM), a mobile DRAM, a Double Data Rate Synchronous Dynamic Random Access Memory (DDR SDRAM), a Low Power DDR (LPDDR) SDRAM, a Graphic DDR (GDDR) SDRAM, a Rambus Dynamic Random Access Memory (RDRAM), etc. In some other example embodiments, the memory cell may be a nonvolatile memory cell, and the memory device 20 as the non-limiting example may be an Electrically Erasable Programmable Read-Only Memory (EEPROM), a flash memory, a Phase Change Random Access Memory (PRAM), a Resistance Random Access Memory (RRAM), a Nano Floating Gate Memory (NFGM), a Polymer Random Access Memory (PoRAM), a Magnetic Random Access Memory (MRAM), a Ferroelectric Random Access Memory (FRAM), etc. Hereinafter, it will be described that the memory device 20 is the DRAM, but the example embodiments are not limited thereto.

As a storage capacity of the memory device 20 increases and operating speeds of devices accessing the memory device 20 increase, the memory controller 10 and the memory device 20 may support a high-speed interface in order to meet a requirement, standard, or desire for the high-speed transmission. The memory controller 10 may transmit various signals, e.g., an address signal, a control signal, a clock signal, etc., to the memory device 20, and the memory controller 10 may train a command and address (CA or C/A) signal for the clock signal in order to transmit/receive.

The memory controller 10 may transmit a CA signal and a data clock (WCK) signal to the memory device 20, and transmit/receive a data (DQ) signal to/from the memory device 20. For example, the data clock (WCK) signal may be transmitted to the memory device 20 through a clock line provided between the memory controller 10 and the memory device 20, and the memory device 20 may capture the CA signal, the DQ signal, etc., based on the data clock (WCK) signal received from the memory controller 10. Further, the memory device 20 transmits the DQ signal synchronized with the data clock (WCK) signal to the memory controller 10 to allow the memory controller 10 to capture the DQ signal. In some example embodiments, the data clock (WCK) signal may be transmitted as a differential signal (WCK/WCKB) through two signal lines. In some example embodiments, the memory device 20 may operate in synchronization with a rising edge of the data clock (WCK) signal or operate in synchronization with a falling edge.

In order to capture the CA signal, the DQ signal, etc., by using the data clock (WCK) signal which operates at a high speed, the memory controller 10 may train the CA signal for a data clock (WCK). In addition, the memory controller 10 may receive a response of the memory device 20 to the trained CA signal. The memory controller 10 may adjust a transmission timing or a delay of the signal transmitted to the memory device 20 based on the response received from the memory device 20. For example, the memory controller 10 may transmit a specific command to the memory device 20 through a command bus, and determine whether the DQ signal transmitted through the data bus is accurately captured by the memory device 20 at the rising edge or the falling edge of the data clock (WCK). The training may be entered when power is supplied to the memory system 1 or a specific condition is satisfied, and a specific command for driving the replica circuit (e.g., an oscillator) for training may be used for entry. For example, in order to start the training, the replica circuit may be enabled by using the specific command, and a count value for a desired time interval is monitored to detect a delay change.

Unlike a case where a clock CK for the memory system 1 to transmit the command and a clock WCK for transmitting data are distinguished (e.g., graphics double data rate type six synchronous dynamic random-access memory (GDDR6)), the memory system 1 according to some example embodiments may divide and use the clock for transmitting the command from the data clock (WCK) signal. When the clock is divided and used from the data clock (WCK) signal, the CA signal is input into a sampler (e.g., a CA sampler 230 of FIG. 2) immediately from a pad for reduction of power consumption, while in the case of the data clock (WCK) for capturing the CA signal, the data clock (WCK) may be input into the sampler after passing through a path (hereinafter, referred to as "WCK path") including an intermediate circuit (e.g., a clock distribution network 200 of FIG. 2) such as a buffer, a divider, etc. In this case, since a delay variation which occurs in the WCK path serves as a deterministic jitter for the sampler, the delay of the WCK path needs or is desired to be maintained to a constant value while the memory device 20 operates.

However, a scheme of enabling the replica circuit for detecting the delay of the WCK path may not be used by using a specific command when the WCK path deviates from a center of the CA signal upon capturing as the delay variation of the WCK path is large. The delay variation of the WCK path becomes large by a voltage variation or a temperature variation, so a failure occurs due to a lack of a CA sampling margin. Hereinafter, a method which may enable the replica circuit and perform the training without enabling the replica circuit by using a specific command in a structure of dividing and using the clock for transmitting the command from the data clock (WCK) signal will be described.

In some example embodiments, the memory controller 10 may include a timing controller 100, a training module 110 and a parity generator 120. In addition, the memory device 20 may include a clock distribution network 200, a CA parity module 210, and a replica circuit 220.

The timing controller 100 may control transmission timings of the signals which the memory controller 10 transmits to the memory device 20, e.g., the CA signal, the data clock (WCK) signal, and the DQ signal. The timing controller 100 may determine a transmission timing based on an initial desired (or alternatively, predetermined) value, and then adjust the transmission timing by reflecting a training result provided from the training module 110.

The training module 110 may detect the delay variation in order to improve capture accuracy of the signals which the memory controller 10 transmits to the memory device 20. In some example embodiments, the training module 110 may start to operate when a parity error occurs for the CA signal. That is, the training module 110 may enter CA training when the parity error occurs.

Specifically, the parity generator 120 may generate a parity signal PS including a parity computed from a signal bit of the CA signal. In addition, the parity generator 120 may transmit the generated parity signal PS to the memory device 20. For example, the parity generator 120 may compute the parity from an address signal bit or a command signal bit of the CA signal. In some example embodiments, the parity generator 120 may combine the computed parity and parity signal, and then generate the parity signal PS including an odd parity or an even parity therefor. In some example embodiments, the parity generator 120 may also generate parity signals for a row address strobe signal, a column address strobe signal, a write enable signal, an address bus signal, and a bank selection signal.

The clock distribution network 200 may generate a first division clock WCK4 signal for sampling the CA signal and a second division clock (WCK2) signal for sampling the DQ signal from the data clock (WCK) signal. The clock distribution network 200 is to divide and use the clock for transmitting the command as described above from the data clock (WCK) signal.

The CA parity module 210 may determine whether a parity error occurs for the CA signal received from the memory controller 10 and a CA signal received from the parity signal PS corresponding thereto. The parity module 210 may include parity check circuitry including logic gates and/or other processing circuitry configured to check for parity errors for the CA signal and parity signal PS corresponding to the CA signal. When it is determined that the parity error occurs, for example, when the failure of the command occurs, the CA parity module 210 may generate a parity error signal PES and transmit the generated parity error signal PES to the memory controller 10. The training module 110 may enter CA training when receiving the parity error signal PES.

The replica circuit 220 may provide a signal delayed as large as a pre-designed or desired delay amount after entering the CA training. The replica circuit 220 may be activated when entering the CA training, and the training module 110 monitors the replica circuit 220 to adjust the transmission timing of the data clock (WCK) signal.

According to some example embodiments, in a memory system 1 having a structure of dividing and using the clock for transmitting the command from the data clock (WCK) signal, occurrence of the parity error for the CA signal is set as a training entry condition, and as a result, the replica circuit 220 may be enabled and training entry may be successful regardless of a case of deviating from the center of the CA signal upon capturing as the large delay variation of the WCK path.

Figure 2:
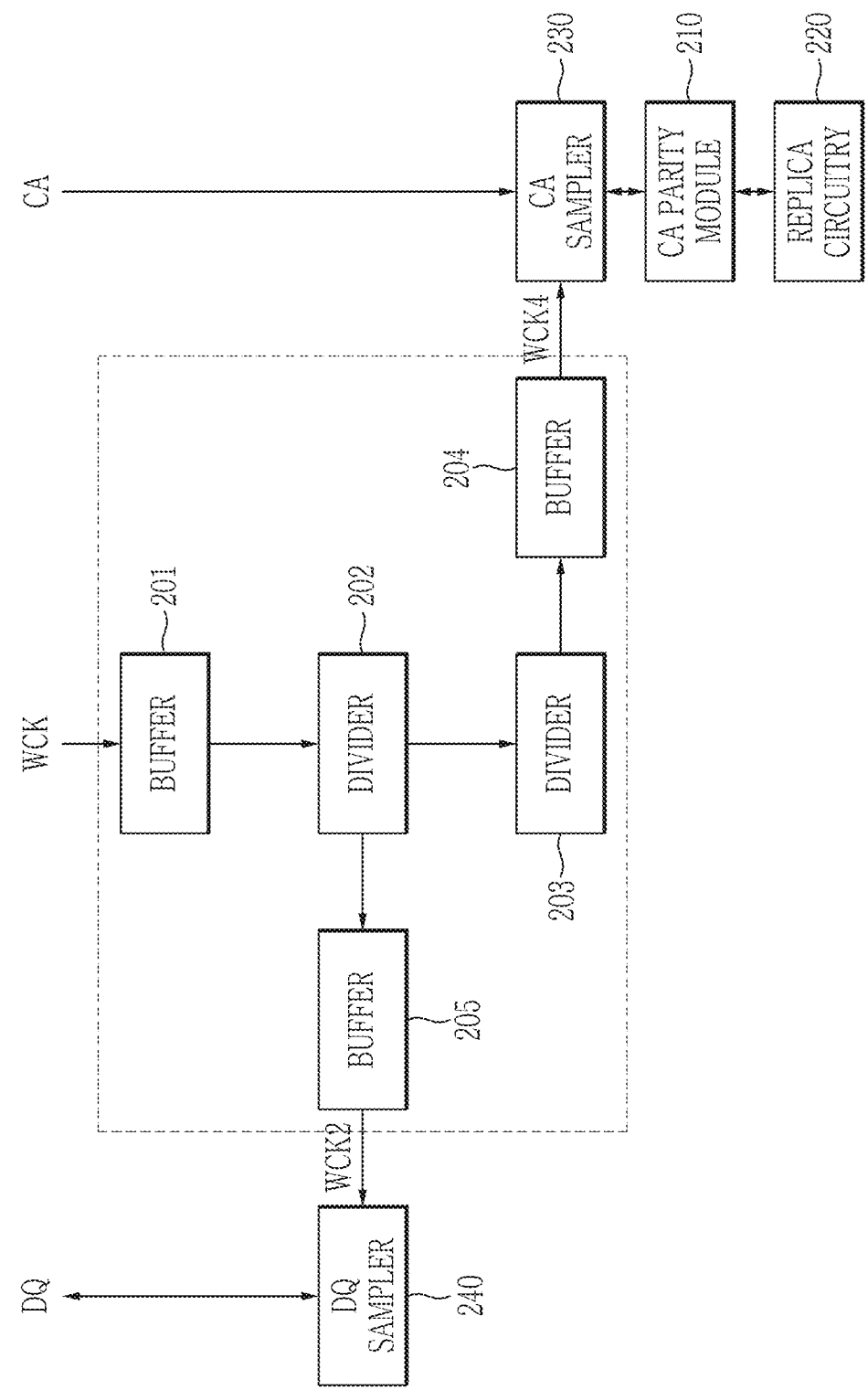
FIG. 2 is a diagram illustrating a memory device according to some example embodiments.
Figure 3:
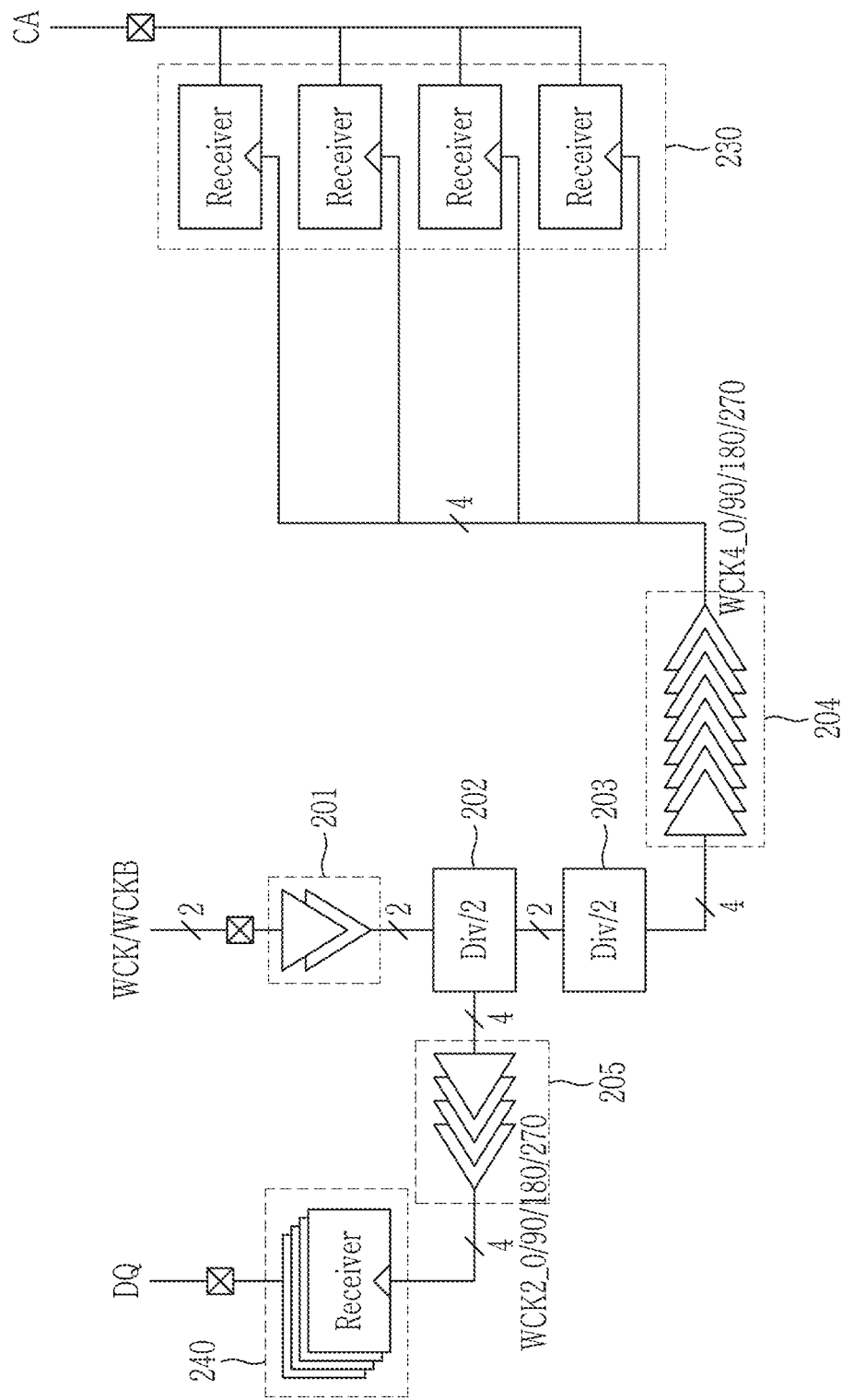
FIG. 3 is a diagram illustrating one implementation example of a memory device according to some example embodiments.

FIG. 2 is a diagram illustrating a memory device according to some example embodiments and FIG. 3 is a diagram illustrating one implementation example of a memory device according to some example embodiments.

Jointly referring to FIGS. 2 and 3, the memory device 20 according to some example embodiments may include a clock distribution network 200, a CA parity module 210, a replica circuit 220, a CA sampler 230, and a DQ sampler 240. The memory device 20 may receive the data clock (WCK) signal through a first pad, and receive the CA signal through a second pad. In addition, the memory device 20 may transmit/receive the data (DQ) signal through a third pad.

The clock distribution network 200 may include a first buffer 201, a second buffer 204, and a third buffer 205. The first buffer 201, the second buffer 204, and the third buffer 205 may be delay circuits. For example, the first buffer 201, the second buffer 204, and the third buffer 205 may include a delay chain including a plurality of inverters.

Meanwhile, the clock distribution network 200 may include a first divider 202 and a second divider 203. The first divider 202 may primarily divide the data clock (WCK/WCKB) signal into two and the second divider 203 may secondarily divide an output signal of the first divider 202 into two. A first division clock (WCK4) signal for sampling the CA signal may correspond to an output signal of the second divider 203 and a second division clock (WCK2) signal for sampling the DQ signal may correspond to an output signal of the first divider 202.

The first buffer 201 may buffer the data clock (WCK) signal received through the first pad.

The second buffer 204 may generate the first division clock (WCK4) signal into 4-phase clock signals (WCK4_0/90/180/270) having a phase difference of 90 degrees from each other. The first division clock (WCK4) signal may be input into the CA sampler 230 as the 4-phase clock signal (WCK4_0/90/180/270) having the phase difference of 90 degrees from each other, and the CA sampler 230 may sample the CA signal based on the first division clock (WCK4) signal. In some example embodiments, the CA sampler 230 may include a plurality of receivers. Each receiver may capture the CA signal in each of (or alternatively, at least one of) the rising edge or the falling edge of the 4-phase clock signal (WCK4_0/90/180/270). That is, each of (or alternatively, at least one of) the plurality of receivers may capture the CA signal by setting the 4-phase clock signal (WCK4_0/90/180/270) as a sampling clock signal.

The third buffer 205 may generate the second division clock (WCK2) signal into 4-phase clock signals (WCK2_0/90/180/270) having the phase difference of 90 degrees from each other. The second division clock (WCK2) signal may be input into the DQ sampler 240 as the 4-phase clock signal (WCK2_0/90/180/270) having the phase difference of 90 degrees from each other, and the DQ sampler 240 may sample the DQ signal based on the second division clock (WCK2) signal.

When the parity error occurs for the CA signal received jointly with the parity signal PS, the CA parity module 210 may trigger the CA training and enable the replica circuit 220. For example, the CA parity module 210 transmits the parity error signal PES to the memory controller 10 to allow the training module 110 to enter the CA training and enable the replica circuit 220 for the CA training. The training module 110 may be included in processing circuitry of the memory controller 10. The CA training may be performed by comparing a reference delay code which is known in advance and a delay code detected from the replica circuit 220.

Figure 4:
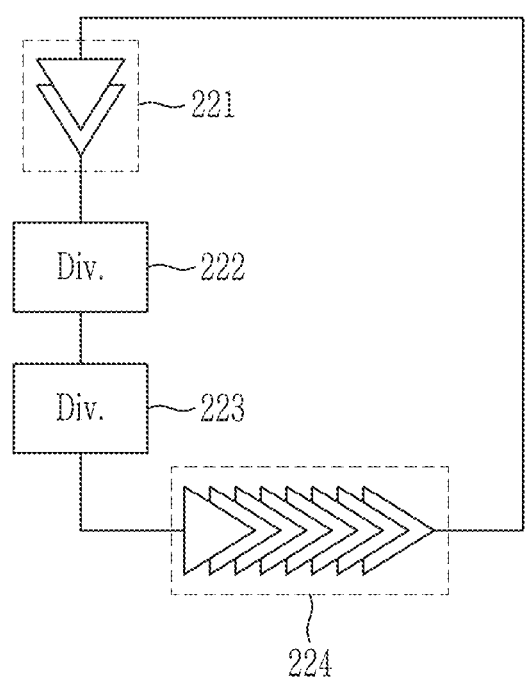
FIG. 4 is a diagram illustrating one implementation example of a replica circuit according to some example embodiments.

FIG. 4 is a diagram illustrating one implementation example of a replica circuit according to some example embodiments.

Referring to FIG. 4, the replica circuit 220 may include a fourth buffer 221, a third divider 222, a fourth divider 223, and a fifth buffer 224 implemented to correspond to the first buffer 201, the first divider 202, the second divider 203, and the second buffer 204 of FIG. 3. When the replica circuit 220 is enabled with the occurrence of the parity error, and the replica circuit 220 operates as an oscillator (hereinafter, also referred to as "WCK oscillator") and monitors a count value during a desired time interval, the replica circuit 220 may detect the delay variation. Information on the detected delay variation may be delivered to the training module 110 through the CA parity module 210, and the transmission timing of the data clock (WCK) signal may be adjusted.

Figure 5:
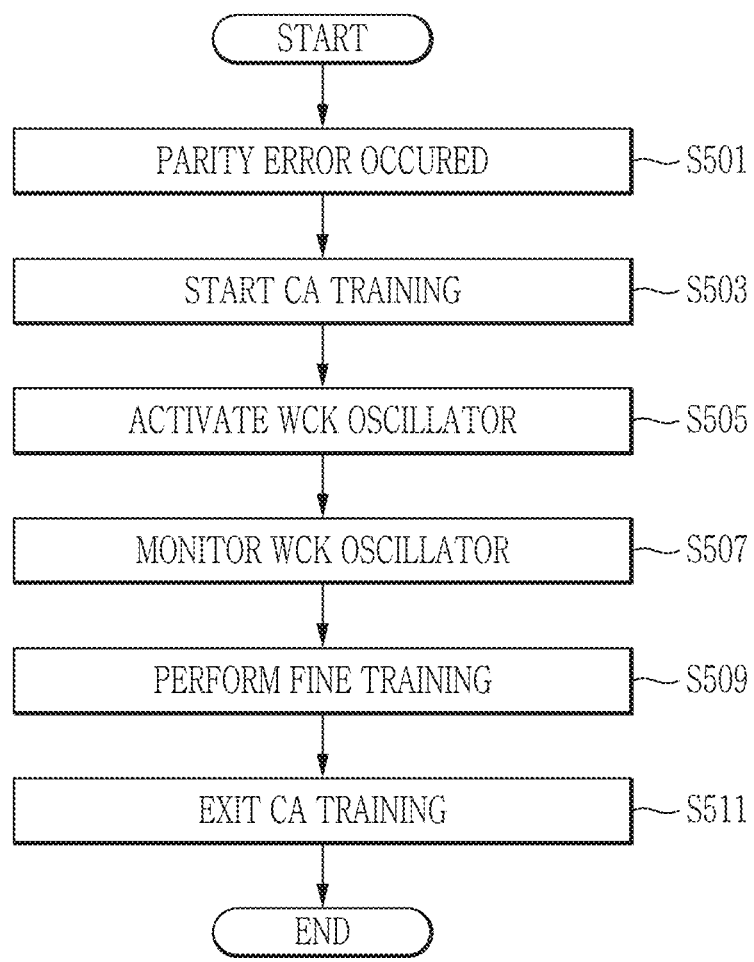
FIG. 5 is a flowchart for describing a method for operating a memory system according to some example embodiments.

FIG. 5 is a flowchart for describing a method for operating a memory system according to some example embodiments.

Referring to FIG. 5, an operating method of a memory system according to some example embodiments may include transmitting a CA signal and a data clock (WCK) signal to a memory device 20 from a memory controller 10, and transmitting/receiving a DQ signal; generating, by the memory device 20, a first division clock (WCK4) signal for sampling the CA signal and a second division clock (WCK2) signal for sampling the DQ signal from data clock (WCK) signal; and sampling, by the memory device 20, the CA signal based on the first division clock signal (WCK4).

Next, in the method, in step S501, the occurrence of the parity error may be detected. As a result, the memory device 20 may output a parity error signal PES indicating that the parity error occurs for the CA signal.

In the method, in step S503, CA training may be started. That is, when the memory controller 10 receives the parity error signal PES, a training module 110 may enter the CA training. Further, in the method, in step S505, the WCK oscillator may be activated. After being activated, the WCK oscillator may provide a signal delayed as large as a predesigned or desired delay amount after entering the CA training. Next, in the method, in step S507, the WCK oscillator may be monitored in order to adjust the transmission timing of the data clock (WCK) signal.

Next, in the method, in step S509, training for the CA signal may be performed. In some example embodiments, the training module 110 may perform digitally control delay line (DCDL) fine training in order to adjust the transmission timing of the data clock (WCK) signal. Here, the term fine training is distinguished from coarse training to be described below in relation to FIGS. 6 to 8, and may correspond to adjusting a timing in a range within 1 unit interval (UI) in the data clock (WCK) signal. The coarse training may mean another scheme of adjusting the timing of the data clock (WCK) signal by the unit of U.

After the training for the CA signal is completed, in the method, in step S511, the CA training may be terminated. Timing information adjusted jointly therewith may be set in a timing controller 100 and the WCK oscillator may be deactivated.

As such, in a memory system 1 having a structure of dividing and using the clock for transmitting the command from the data clock (WCK) signal, occurrence of the parity error for the CA signal is set as a training entry condition, and as a result, the WCK oscillator may be enabled and training entry may be successful regardless of a case of deviating from the center of the CA signal upon capturing as the large delay variation of the WCK path.

Figure 6:
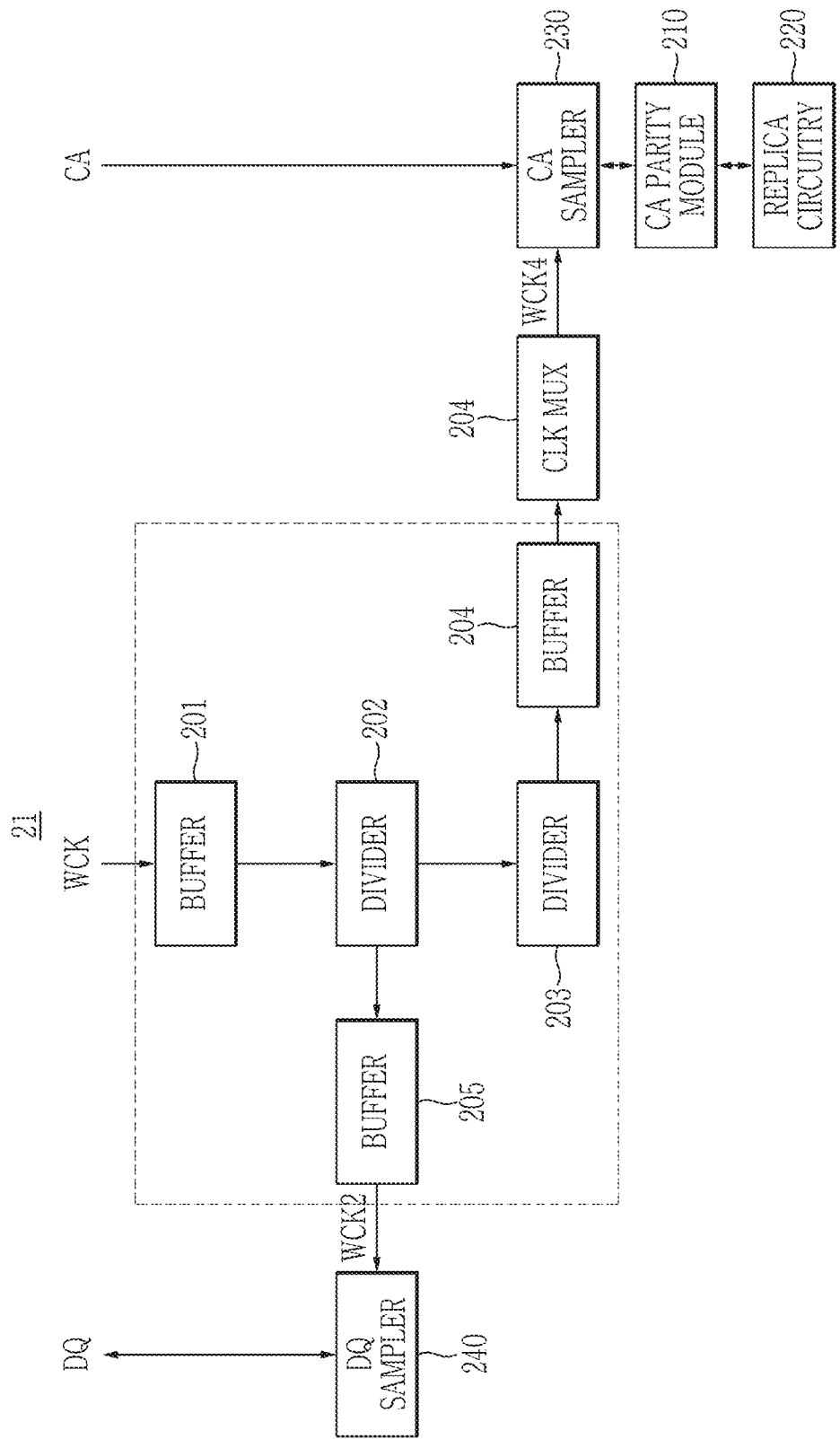
FIG. 6 is a diagram illustrating a memory device according to some example embodiments.
Figure 7:
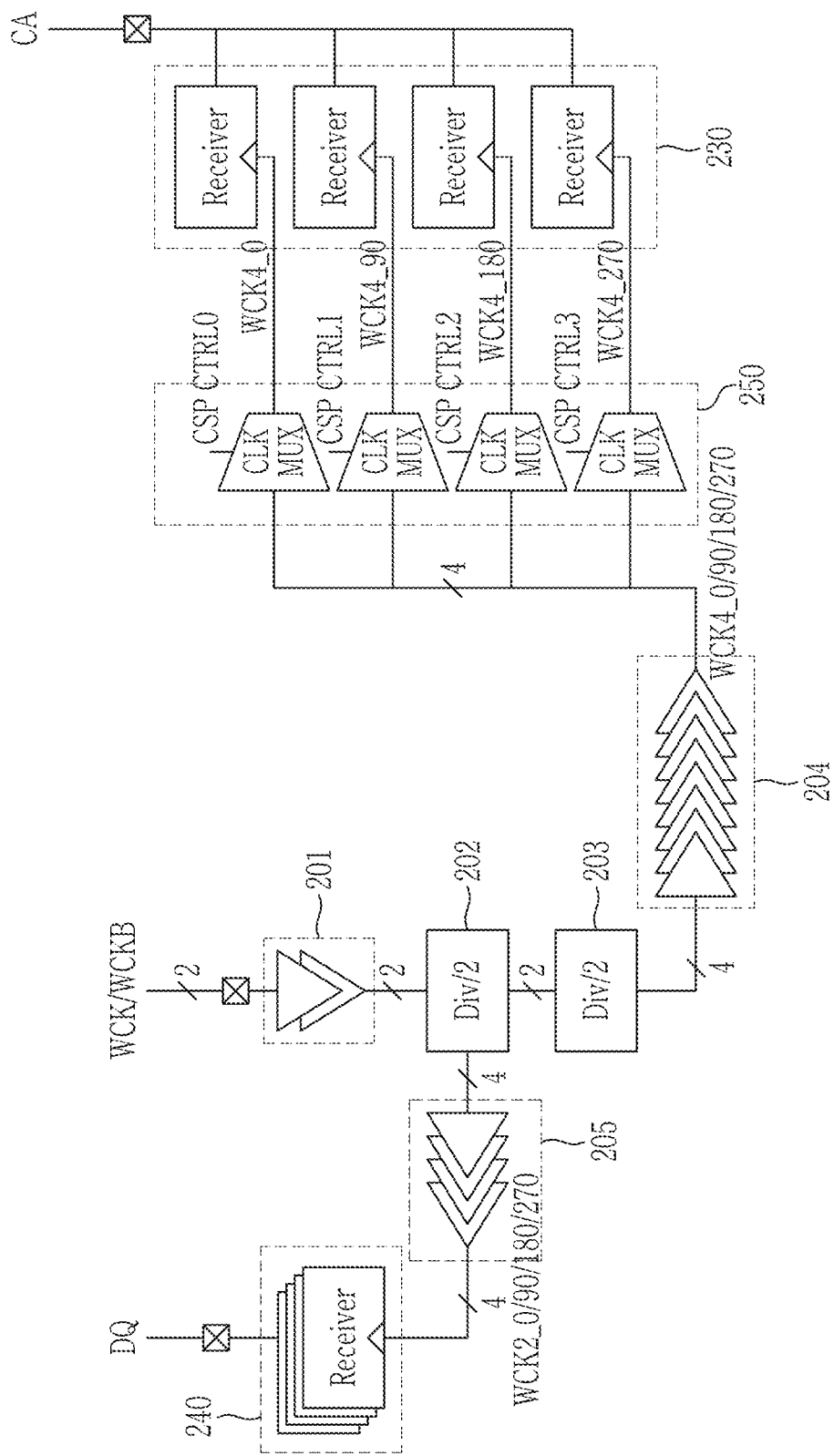
FIG. 7 is a diagram illustrating one implementation example of a memory device according to some example embodiments.

FIG. 6 is a diagram illustrating a memory device according to some example embodiments and FIG. 7 is a diagram illustrating one implementation example of a memory device according to some example embodiments.

Jointly referring to FIGS. 6 and 7, the memory device 21 is the same as those of FIGS. 2 and 3 in that a memory device 21 according to some example embodiments may include the clock distribution network 200, the CA parity module 210, the replica circuit 220, the CA sampler 230, and the DQ sampler 240, but different from those of FIGS. 2 and 3 in that a clock multiplexer (MUX) 250 is additionally provided.

The clock multiplexer 250 may be disposed between the second buffer 204 and the CA sampler 230. The clock multiplexer 250 may select one clock signal of 4-phase clock signals having a phase difference of 90 degrees from each other and provide the selected clock signal to the CA sampler 230, and the clock multiplexer 250 is used for performing the coarse training mentioned above.

The training module 110 may perform the coarse training by the unit of UI in order to adjust the transmission timing of the data clock (WCK) signal. In some example embodiments, the coarse training may be performed jointly with the fine training of adjusting the timing in the range within 1 UI in the data clock (WCK) signal, and performed prior to the fine training. As a result, when the timing adjustment of 1 UI or more is required or desired, both the coarse training and the fine training are adopted to efficiently complete the timing adjustment within a shorter time than a case of adjusting only the fine training.

Specifically, the clock multiplexer 250 may include a first clock multiplexer to a fourth clock multiplexer which operate based on a first control signal CSP_CTRL0 to a fourth control signal CSP_CTRL3, respectively. Further, the CA sampler 230 may first to fourth receivers that capture the CA signal in each of (or alternatively, at least one of) the rising edge or the falling edge of the 4-phase clock signal (WCK4_0/90/180/270).

For example, the first clock multiplexer may select one clock signal WCK4_0 among 4-phase clock signals (WCK4_0/90/180/270) having the phase difference of 90 degrees from each other based on the first control signal CSP_CTRL0 and provide the selected clock signal to a first receiver, and the first receiver may capture the CA signal at the rising edge or falling edge of the clock signal WCK4_0. For example, the second clock multiplexer may select other one clock signal WCK4_90 among 4-phase clock signals (WCK4_0/90/180/270) based on the second control signal CSP_CTRL1 and provide the selected clock signal to a second receiver, and the second receiver may capture the CA signal at the rising edge or falling edge of the clock signal WCK4_90. The third clock multiplexer may select the other one clock signal WCK4_180 among 4-phase clock signals (WCK4_0/90/180/270) based on the third control signal CSP_CTRL2 and provide the selected clock signal to a third receiver, and the third receiver may capture the CA signal at the rising edge or falling edge of the clock signal WCK4_180. The fourth clock multiplexer may select the other one clock signal WCK4_270 among 4-phase clock signals (WCK4_0/90/180/270) based on the fourth control signal CSP_CTRL3 and provide the selected clock signal to a fourth receiver, and the fourth receiver may capture the CA signal at the rising edge or falling edge of the clock signal WCK4_270.

However, when the CA sampling is performed by using 4-phase clock signals (WCK4_0/90/180/270) having the phase difference of 90 degrees from each other, which is generated by dividing the data clock (WCK) signal, the phase of the 4-phase clock signals (WCK4_0/90/180/270) may be changed based on initial states of the first divider 202 and the second divider 203. For example, the phases of the clock signal WCK4_0 and the clock signal WCK4_180 may be changed. In this case, the phase may be changed to a normal state by performing synchronization for the 4-phase clock signals (WCK4_0/90/180/270) by using the clock multiplexer 250 and a command start point (CSP). For example, in the CA training, when 0 degree and 180 degrees are changed as the phase based on the CSP, a clock signal of a first phase provided to the first receiver among a plurality of receivers and a clock signal of a second phase provided to the second receiver among the plurality of receivers may be exchanged. In addition, the timing adjustment of 1 UI or more may be rapidly performed, so when DSDL fine training is subsequently performed after the exchange, the timing adjustment may be efficiently completed within a shorter time than the case of adjusting only the fine training. The adjustment may be implemented by changing the CSP corresponding to the control signal of the clock multiplexer 250. That is, according to some example embodiment, it is possible to train the delay variation in a wide range without a need for adding a separate circuit only by the clock multiplexer 250.

Figure 8:
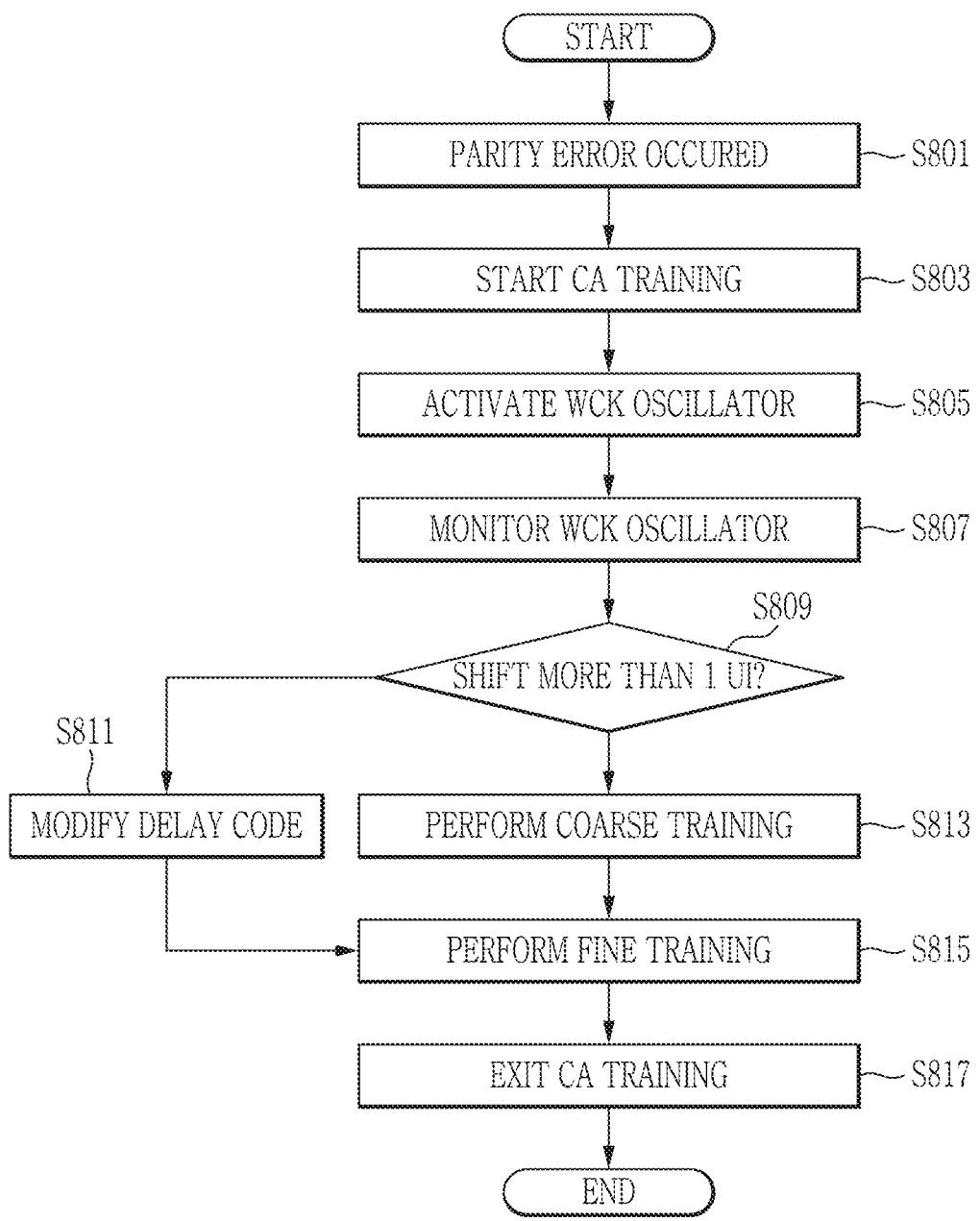
FIG. 8 is a flowchart for describing a method for operating a memory system according to some example embodiments.

FIG. 8 is a flowchart for describing a method for operating a memory system according to some example embodiments.

Referring to FIG. 8, an operating method of a memory system according to some example embodiments may include transmitting a CA signal and a data clock (WCK) signal to a memory device 20 from a memory controller 10, and transmitting/receiving a DQ signal; generating, by the memory device 20, a first division clock (WCK4) signal for sampling the CA signal and a second division clock (WCK2) signal for sampling the DQ signal from data clock (WCK) signal; and sampling, by the memory device 20, the CA signal based on the first division clock signal (WCK4).

Next, in the method, in step S801, the occurrence of the parity error may be detected. As a result, the memory device 20 may output a parity error signal PES indicating that the parity error occurs for the CA signal.

In the method, in step S803, CA training may be started. That is, when the memory controller 10 receives the parity error signal PES, a training module 110 may enter the CA training. Further, in the method, in step S805, the WCK oscillator may be activated. After being activated, the WCK oscillator may provide a signal delayed as large as a pre-designed or desired delay amount after entering the CA training. Next, in the method, in step S807, the WCK oscillator may be monitored in order to adjust the transmission timing of the data clock (WCK) signal.

As a result of performing monitoring, in the method, in step S809, it may be determined whether a shift amount due to a delay is equal to or less than 1 UI. When the shift amount due to the delay is more than 1 UI (S809, 'Y'), the coarse training may be performed by the unit of UI for the CA signal in step S813 in the method. Next, in the method, in step S815, the fine training may be performed for adjustment less than 1 UI for the CA signal. Unlike this, when the shift amount due to the delay is not more than 1 UI (S809, 'N'), a delay code may be modified in step S811 and the process proceeds to step S815 to perform the fine training in the method.

After the training for the CA signal is completed, in the method, in step S817, the CA training may be terminated. Timing information adjusted jointly therewith may be set in a timing controller 100 and the WCK oscillator may be deactivated.

FIGS. 9 to 12 are diagrams for describing an operation of a memory system according to an example embodiment.

Figure 9:
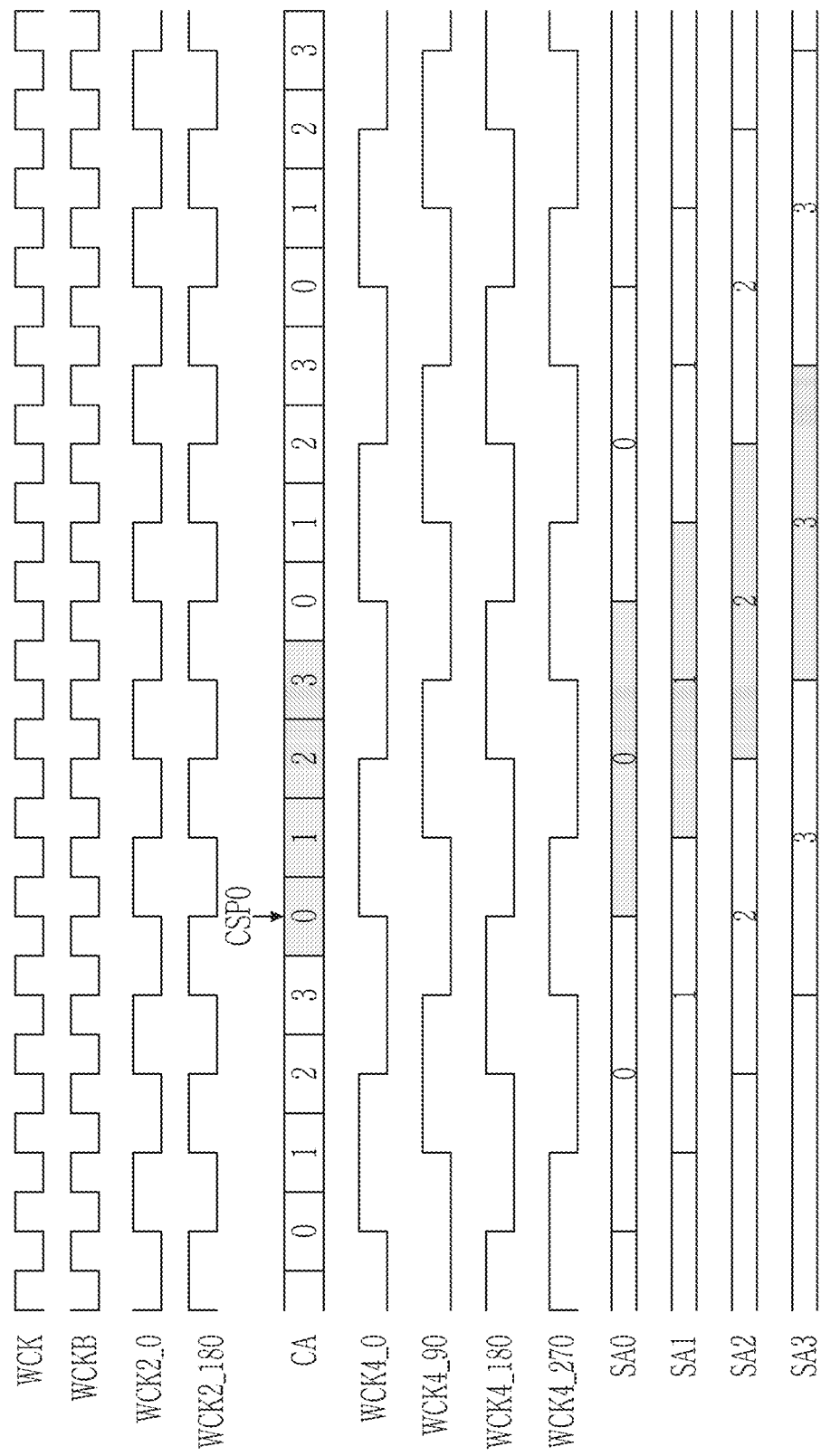
FIG. 9, FIG. 10, FIG. 11, and FIG. 12 are each a diagram for describing an operation of a memory system according to some example embodiments.

Referring to FIG. 9, the data clock (WCK) signal and the differential signal WCKB are illustrated, and signals WCK2_0 and WCK2_180 are illustrated which are acquired by primarily dividing the signals into two. Further, signals WCK4_0 and WCK4_90 are illustrated, which are acquired by dividing the signals WCK2_0 and WCK2_180 into two. As illustrated, the clock signal WCK4_0 may capture the CA signal at the rising edge (first receiver) and the clock signal WCK4_90 may capture the CA signal at the rising edge having a phase difference of 90 degrees from each other from the clock signal WCK4_0 (second receiver). Further, the clock signal WCK4_180 may capture the CA signal at the rising edge having the phase difference of 90 degrees from each other from the clock signal WCK4_90 (third receiver) and the clock signal WCK4_270 may capture the CA signal at the rising edge having the phase difference of 90 degrees from each other from the clock signal WCK4_180 (fourth receiver).

In this case, the CSP (CSP0) may control the first clock multiplexer to select the clock signal WCK4_0, and as a result, an output signal SA0 of the first receiver may indicate '0' which is a value acquired by capturing the CA signal. Similarly, the control signal is applied to the second clock multiplexer to the fourth clock multiplexer to select the clock signal WCK4_90 to the clock signal WCK4_270, and output signals SA1 to SA3 of the second to fourth receivers may indicate '1', '2', and '3' which is a value acquired by capturing the CA signal, respectively.

Figure 10:
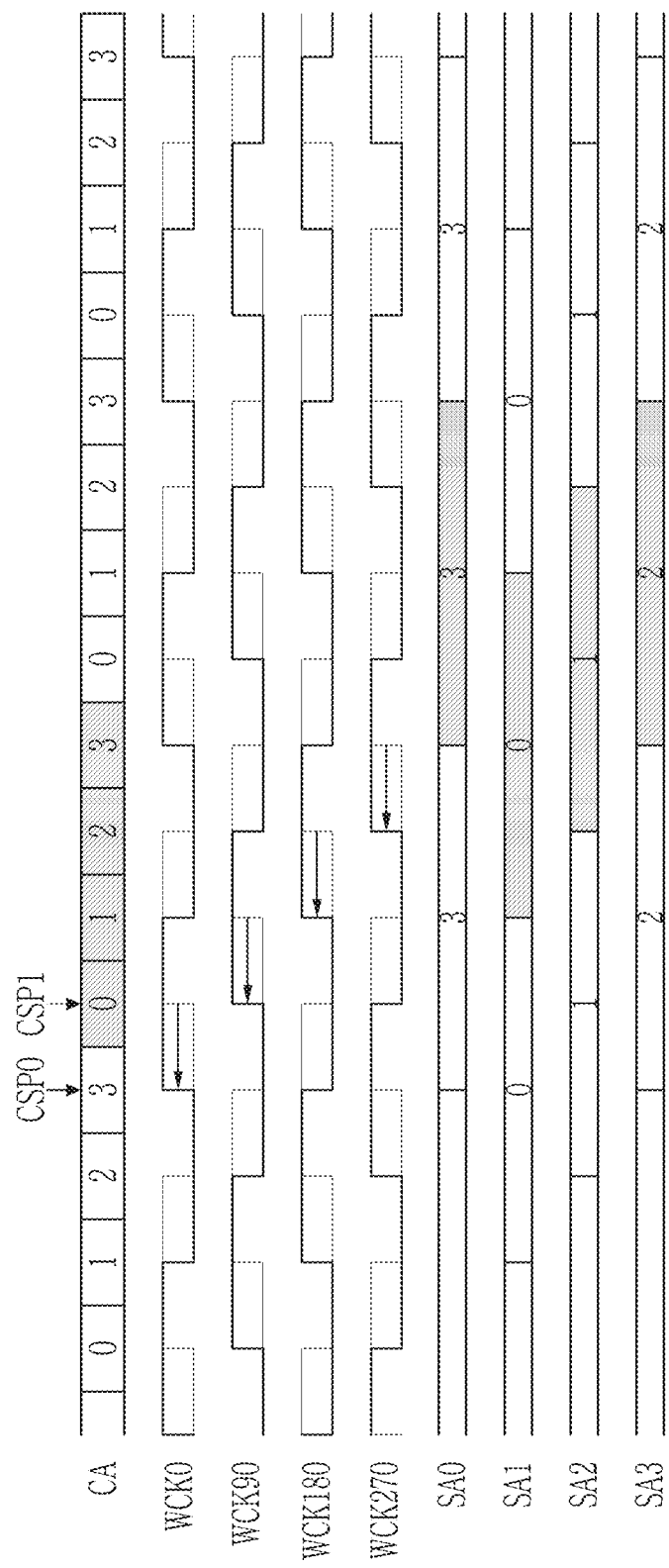

Referring to FIG. 10, a case where the data clock (WCK) signal is earlier than 1 UI or more is a case where the phase of the clock signal WCK4_0 at a location of the CSP (CSP0) is earlier by 90 degrees or more. In this case, since the first receiver does not normally capture the CA signal, but captures the CA signal at a location earlier by 90 degrees or more, the output signal SA0 indicates '3' and the output signals SA1, SA2, and SA3 indicate '0', '1', and '2', respectively. Therefore, the CSP is changed through the coarse training by the unit of UI according to some example embodiments to adjust the timing.

Figure 11:
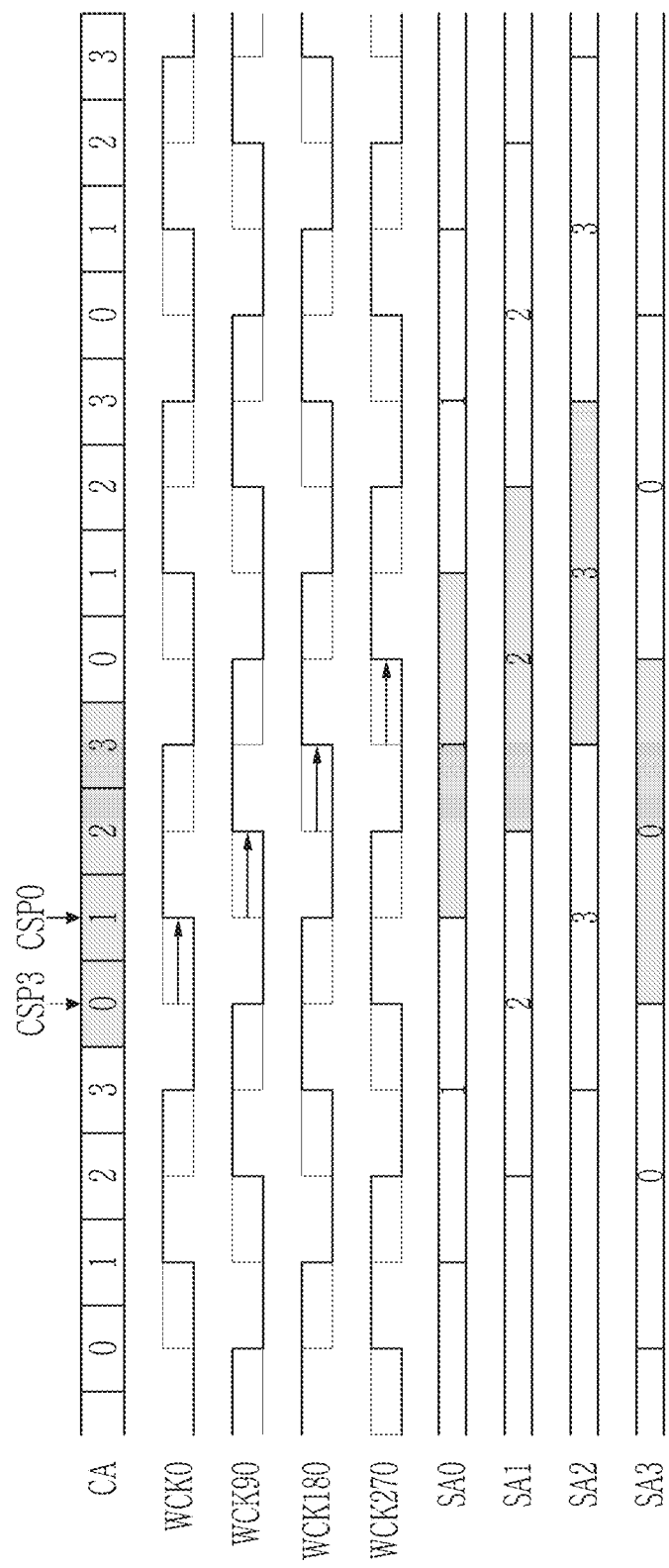

Referring to FIG. 11, a case where the data clock (WCK) signal is later than 1 UI or more is a case where the phase of the clock signal WCK4_0 at the location of the CSP (CSP0) is delayed by 90 degrees or more. In this case, since the first receiver does not normally capture the CA signal, but captures the CA signal at a location later by 90 degrees or more, the output signal SA0 indicates '1' and the output signals SA1, SA2, and SA3 indicate '2', '3', and '0', respectively. Therefore, the CSP is changed through the coarse training by the unit of UI according to some example embodiments to adjust the timing.

Figure 12:
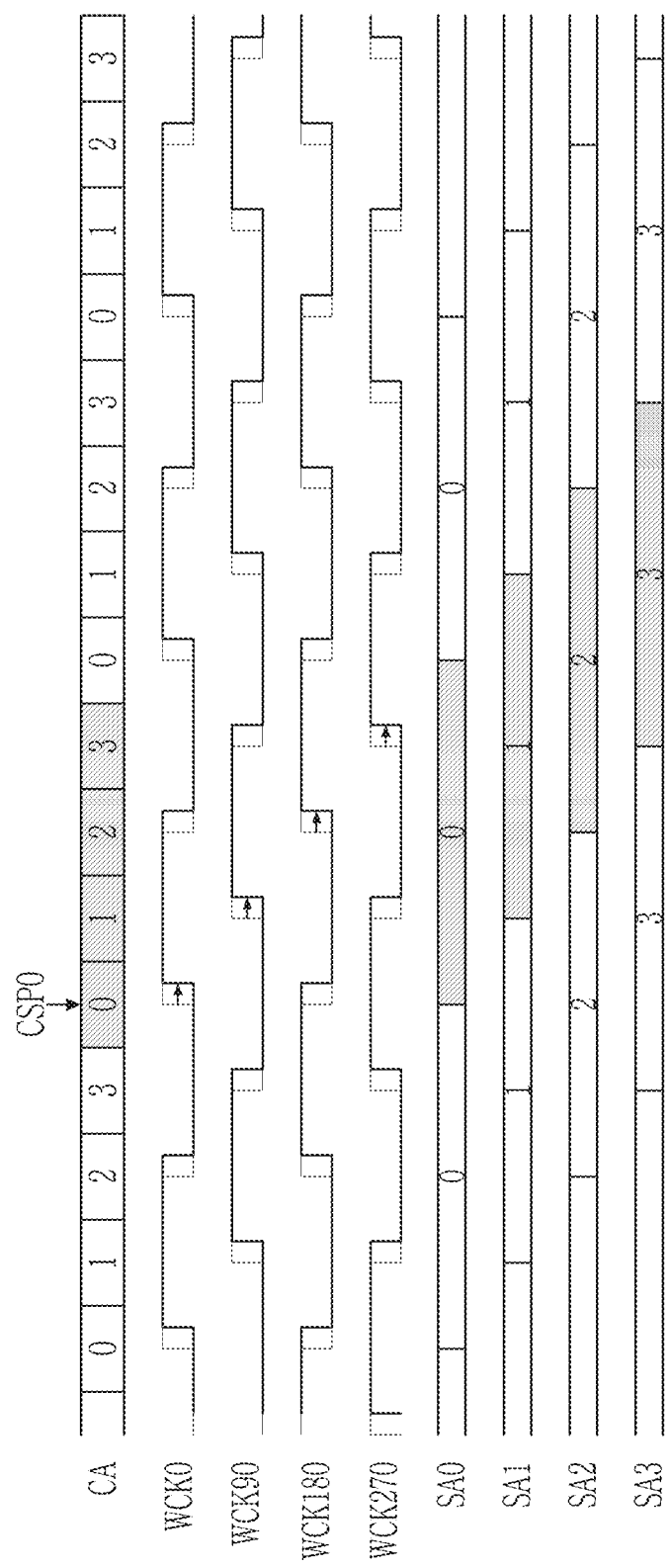

Referring to FIG. 12, a case where the data clock (WCK) signal is later by less than 1 UI is a case where the phase of the clock signal WCK4_0 at the location of the CSP (CSP0) is delayed by less than 90 degrees. In this case, the output signals SA1 to SA3 of the first to fourth receivers indicate '0', '1', '2', and '3' which are values acquired by capturing the CA signal, but the timing adjustment is possible through the fine training for the delay variation.

Figure 13:
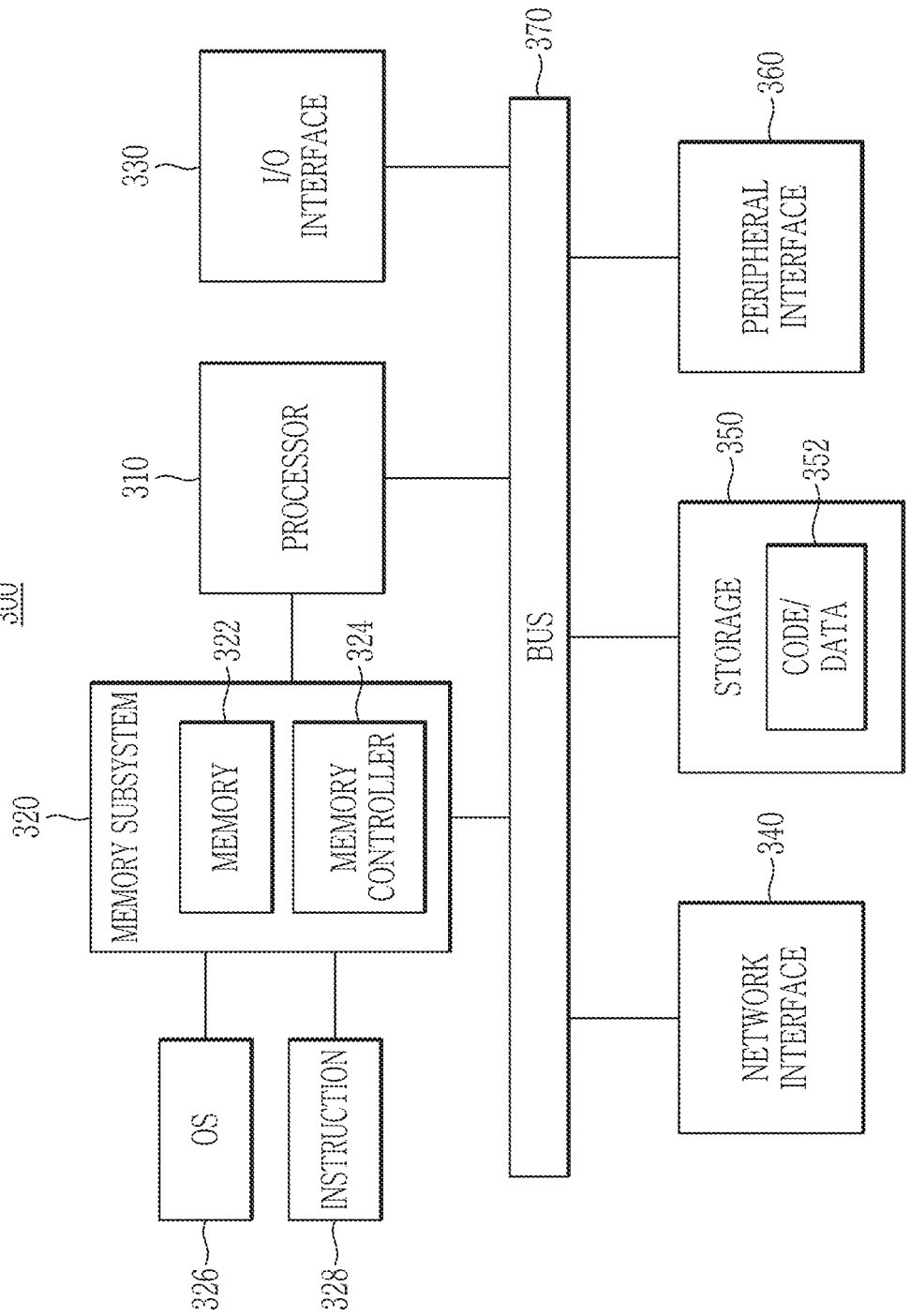
FIG. 13 is a diagram illustrating a computing system according to some example embodiments.

FIG. 13 is a diagram illustrating a computing system according to some example embodiments.

Referring to FIG. 13, a computing system 300 according to some example embodiments may be a computing device, for example, a laptop computer, a desktop computer, a server, a game or entertainment control system, a scanner, a copier, a printer, a routing or switching device, or other electronic devices. The computing system 300 may include a processor 310, and this may provide processing for the computing system 300, operation management, and execution of instructions. The processor 310 may include a designated (or alternatively, predetermined) type of microprocessor, a central processing unit (CPU), a processing core, or other processing hardware providing processing for the computing system 300. The processor 310 may control all operations of the computing system 300, and may be one or more programmable universal or special-purpose microprocessors, digital signal processors (DSPs), programmable controllers, application specific integrated circuits (ASICs), programmable logic devices (PLDs), or a device similar thereto.

A memory sub system 320 represents a main memory of the computing system 300, and the memory sub system 320 may provide a temporary storage for data values to. The memory sub system 320 may include a read-only memory (ROM), a flash memory, one or more various random access memories (RAM), or one or more memory devices such as other memory devices, or a combination of the devices. The memory sub system 320 may store and host an operating system (OS) 326 providing a software platform for execution of instructions in the computing system 300, in particular. Additionally, other instructions 328 are stored in the memory sub system 320 and executed therefrom to provide logic and processing of the computing system 300. The OS 326 and the instructions 328 may be executed by the processor 310.

The memory sub system 320 may include a memory device 322, and here, the memory device may store data, instructions, programs, or other items. In some example embodiments, the memory sub system may include a memory controller 324, and this may be a memory controller, and may include a scheduler which generates and issues commands for the memory device 322.

In some example embodiments, the memory sub system 320 and the memory device 322 may implement timing compensation based on a feedback generated through periodic training. The memory device 322 enters a training state, and the memory controller 324 sends a training signal through an interface between the memory device 322 and the memory controller, and the memory device 322 does not store the training signal in a memory array thereof. In some example embodiments, the memory device 322 may evaluate a training signal received for errors. In some example embodiments, the memory device 322 may store the training signal in a training buffer, and this may be a designated (or alternatively, predetermined) buffer used for storing the training signal, and the memory controller 324 reads the buffered training signal and evaluates the signal for the errors. Based on the detected errors, the system may control one or more parameters of any one or both of the memory controller or the memory device in order to compensate for variations in environments conditions, which influence the timing.

The processor 310 and the memory sub system 320 may be connected to a bus/bus system 370. The bus 370 may correspond to one or more designated (or alternatively, predetermined) separate physical buses, communication lines/interfaces, and/or point-to-point connections, which are connected by appropriate bridges, adapters, and/or controllers. Therefore, the bus 370 may include, for example, at least one of a Peripheral Component Interconnect (PCI) bus, a HyperTransport or Industry Standard Architecture (ISA) bus, a Small Computer System Interface (SCSI) bus, a Universal Serial Bus (USB), or an Institute of Electrical and Electronics Engineers (IEEE) standard 1394 bus (generally, referred to as "Firewire"). Buses of the bus 370 may also correspond to interfaces in the network interface 340.

The computing system 300 may also include one or more input/output (I/O) interfaces 330 connected to the bus 370, the network interface 340, one or more internal large-capacity storage device(s) 350, and a peripheral device interface 360. The I/O interface 330 may include one or more interface components (e.g., video, audio, and/or alphanumeric interfacing) through which the user interacts with the computing system 300. The network interface 340 provides, to the computing system 300, a capability to communicate with remote devices (e.g., servers and other computing devices) through one or more networks. The network interface 340 may include an Ethernet adapter, wireless interconnection components, a universal serial bus (USB), or other wired or wireless standards or private interfaces.

The storage 350 may be a designated (or alternatively, predetermined) conventional medium storing mass data by a nonvolatile scheme such as one or more magnetic, solid-state optical based disks or a combination thereof or may include the medium. The storage 350 may hold a code or instructions and data 352 in a continuation state. The storage 350 may be regarded as "memory", but the memory 320 is an execution or operation memory providing the instructions to the processor 310. The storage 350 may be nonvolatile, while the memory 320 may include a volatile memory.

The peripheral device interface 360 may include a designated (or alternatively, predetermined) hardware interface which is not specifically mentioned above. Peripheral devices generally refer to devices which dependently access the computing system 300. In the dependent access, the operation is executed, and the software and/or hardware platform with which the user interacts is provided by the computing system 300.

Figure 14:
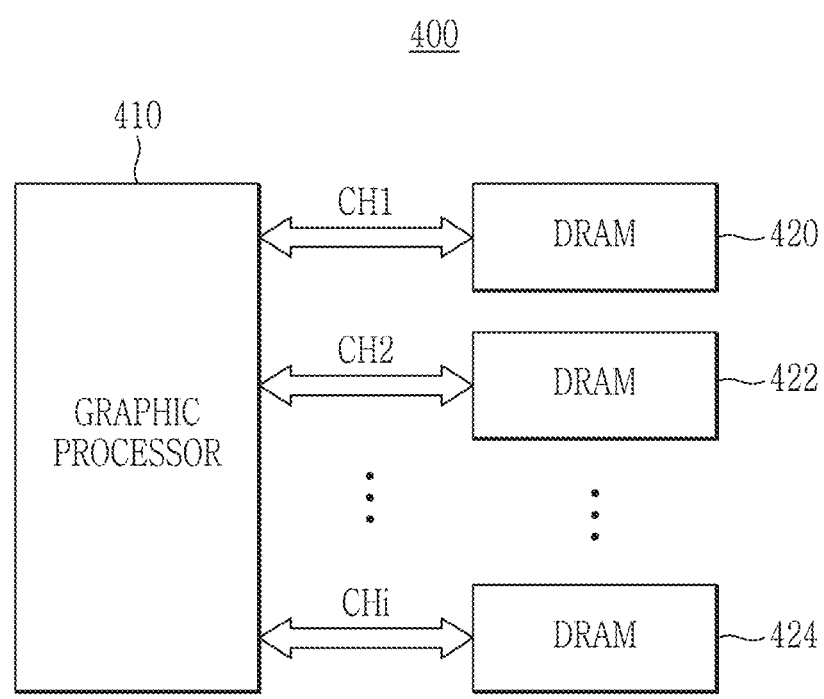
FIG. 14 is a diagram illustrating a graphic system according to some example embodiments.

FIG. 14 is a diagram illustrating a graphic system according to some example embodiments.

Referring to FIG. 14, a graphic system 400 may include a graphic processor 410 and a plurality of DRAM devices 420 to 424. The graphic processor 410 may be configured to perform various computing operations for processing image information. The graphic processor 410 may be connected to the plurality of DRAM devices 420 to 424 through a plurality of channels CH1 to CHi. As an example, each of (or alternatively, at least one of) the plurality of channels CH1 to CHi may be a communication channel based on a graphic double data rate (GDDR) interface.

Each of (or alternatively, at least one of) the plurality of DRAM devices 420 to 424 may be a memory device described with reference to FIGS. 1 to 12. That is, each of (or alternatively, at least one of) the plurality of DRAM devices 420 to 424 may successfully perform training entrance in the memory system having the structure of dividing and using the clock for transmitting the command from the data clock signal.

Any of the elements and/or functional blocks disclosed above may include or be implemented in processing circuitry such as hardware including logic circuits; a hardware/software combination such as a processor executing software; or a combination thereof. For example, the memory controller 10, training module 110, CA parity module 210 processor 310, memory controller 324, and graphic processor 410 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While this invention has been described in connection with some example embodiments, it is to be understood that the invention is not limited to the disclosed example embodiments. On the contrary, it is intended to cover various modifications and equivalent arrangements included within the spirit and scope of the appended claims.

What is claimed is:

1. A memory system comprising
   a memory device; and
   a memory controller configured to transmit a command and address (CA) signal and a data clock signal to the memory device, transmit a data (DQ) signal to the memory device, or receive the DQ signal from the memory device,
   wherein the memory device includes,
   a clock distribution network configured to generate a first division clock signal for sampling the CA signal and a second division clock signal for sampling the DQ signal from the data clock signal,
   a CA sampler configured to sample the CA signal based on the first division clock signal, and
   a CA parity check circuitry configured to output a parity error signal in response to a parity error occurring for the CA signal, and
   the memory controller includes,
   a processing circuitry configured to enter CA training in response to receiving the parity error signal.
2. The memory system of claim 1, wherein:
   the memory device further includes a replica circuit configured to provide a signal delayed as large as a first delay amount after entering the CA training.
3. The memory system of claim 2, wherein:
   the replica circuit is configured to be activated in response to entering the CA training, and
   the processing circuitry is configured to adjust a transmission timing of the data clock signal by monitoring the replica circuit.
4. The memory system of claim 3, wherein:
   the processing circuitry is configured to perform digitally control delay line (DCDL) fine training in order to adjust the transmission timing of the data clock signal.
5. The memory system of claim 3, wherein:
   the processing circuitry is configured to perform coarse training by a unit of unit interval (UI) in order to adjust the transmission timing of the data clock signal.
6. The memory system of claim 5, wherein:
   the memory device includes a clock multiplexer configured to select one clock signal among four phase clock signals, each of the four phase clock signals having a different phase, and provide the selected one clock signal to the CA sampler to perform the coarse training.
7. The memory system of claim 1, wherein:
   the memory controller further includes a parity generator configured to generate a parity signal including a parity computed from a signal bit of the CA signal and transmit the generated parity signal to the memory device.
8. The memory system of claim 1, wherein:
   the memory controller further includes a timing controller configured to control transmission timings of the CA signal, the data clock signal, and the DQ signal.
9. The memory system of claim 1, wherein:
   the clock distribution network includes a first divider configured to divide the data clock signal into two and a second divider configured to divide an output signal of the first divider into two.
10. The memory system of claim 9, wherein:
    the first division clock signal corresponds to an output signal of the second divider and the second division clock signal corresponds to the output signal of the first divider.
11. A memory device comprising
    a first pad configured to receive a data clock signal;
    a second pad configured to receive a command and address (CA) signal;
    a third pad configured to transmit or receive a data (DQ) signal;
    a clock distribution network configured to generate a first division clock signal for sampling the CA signal and a second division clock signal for sampling the DQ signal from the data clock signal;
    a CA sampler sampling the CA signal based on the first division clock signal;
    a DQ sampler sampling the DQ signal based on the second division clock signal; and
    a CA parity check circuitry triggering CA training in response to a parity error occurring for the CA signal.
12. The memory device of claim 11, further comprising:
    a replica circuit configured to be activated after entering the CA training to provide a signal delayed as large as a first delay amount.
13. The memory device of claim 11, wherein:
    the CA sampler includes a plurality of receivers, and
    the first division clock signal includes four phase clock signals, each of the four phase clock signals having a different phase,
    the memory device further includes a plurality of clock multiplexers configured to select one clock signal among the four phase clock signals and provide the selected one clock signal to each of the plurality of receivers, based on a control signal.
14. The memory device of claim 13, wherein:
    the CA training includes exchanging a clock signal of a first phase provided to a first receiver among the plurality of receivers and a clock signal of a second phase provided to a second receiver among the plurality of receivers based on a command start point (CSP).

15. The memory device of claim 14, wherein:
the CA training includes performing DCDL fine training after the exchanging.

16. A method for operating a memory system, comprising:
transmitting a command and address (CA) signal and a data clock signal to a memory device from a memory controller, and transmitting or receiving a data (DQ) signal;
generating, by the memory device, a first division clock signal for sampling the CA signal and a second division clock signal for sampling the DQ signal from the data clock signal
sampling, by the memory device, the CA signal based on the first division clock signal;
outputting, by the memory device, a parity error signal in response to a parity error occurring for the CA signal; and
entering, by the memory controller, CA training in response to receiving the parity error signal.

17. The method of claim 16, further comprising:
activating, by the memory device, a replica circuit to provide a signal delayed as large as a first delay amount after entering the CA training.

18. The method of claim 17, further comprising:
adjusting, by the memory controller, a transmission timing of the data clock signal by monitoring the replica circuit.

19. The method of claim 18, further comprising:
performing, by the memory controller, DCDL fine training to adjust the transmission timing of the data clock signal.

20. The method of claim 18, further comprising:
performing, by the memory controller, coarse training by a unit of UI to adjust the transmission timing of the data clock signal.

* * * * *